United States Patent
Kanno et al.

(10) Patent No.: US 9,252,358 B2
(45) Date of Patent: Feb. 2, 2016

(54) SEMICONDUCTOR MEMORY DEVICE AND METHOD OF MANUFACTURING THE SAME

(71) Applicant: KABUSHIKI KAISHA TOSHIBA, Tokyo (JP)

(72) Inventors: Hiroshi Kanno, Yokkaichi (JP); Takayuki Tsukamoto, Yokkaichi (JP); Hiroyuki Fukumizu, Yokkaichi (JP); Yoichi Minemura, Yokkaichi (JP); Takamasa Okawa, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 43 days.

(21) Appl. No.: 13/767,029

(22) Filed: Feb. 14, 2013

(65) Prior Publication Data
US 2014/0061577 A1    Mar. 6, 2014

Related U.S. Application Data

(60) Provisional application No. 61/695,741, filed on Aug. 31, 2012.

(51) Int. Cl.
*H01L 21/332*    (2006.01)
*H01L 29/06*    (2006.01)
(Continued)

(52) U.S. Cl.
CPC .......... *H01L 45/1206* (2013.01); *H01L 27/249* (2013.01); *H01L 27/2454* (2013.01); *H01L 45/04* (2013.01); *H01L 45/1226* (2013.01); *H01L 45/146* (2013.01); *H01L 45/16* (2013.01); *H01L 45/1658* (2013.01)

(58) Field of Classification Search
CPC ............ H01L 45/1206; H01L 45/1658; H01L 27/249
USPC ........................................ 438/135, 261; 257/5
See application file for complete search history.

(56) References Cited

U.S. PATENT DOCUMENTS

2007/0029607 A1*    2/2007    Kouznetzov .................. 257/321
2010/0019220 A1*    1/2010    Suh .................................. 257/4
(Continued)

FOREIGN PATENT DOCUMENTS

JP    2010-165982    7/2010
JP    2010-287872    12/2010
(Continued)

OTHER PUBLICATIONS

Office Action issued Oct. 27, 2015 in Japanese Patent Application No. 2012-279968 (with English language translation).

*Primary Examiner* — Caridad Everhart
(74) *Attorney, Agent, or Firm* — Oblon, McClelland, Maier & Neustadt, L.L.P.

(57) ABSTRACT

First, a trench penetrating first conductive layers and interlayer insulating layers is formed. Next, a column-shaped conductive layer is formed to fill the trench via a side wall layer. Then, after formation of the side wall layer, by migration of oxygen atoms between the side wall layer and the first conductive layers or migration of oxygen atoms between the side wall layer and the interlayer insulating layers, a proportion of oxygen atoms in the side wall layer adjacent to the interlayer insulating layers is made larger than a proportion of oxygen atoms in the side wall layer adjacent to the first conductive layers, whereby the side wall layer adjacent to the first conductive layers is caused to function as the variable resistance element.

20 Claims, 11 Drawing Sheets

∘ : Oxygen Atom (51) Int. Cl.
*H01L 45/00* (2006.01)
*H01L 27/24* (2006.01)

(56) References Cited

U.S. PATENT DOCUMENTS

| | | |
|---|---|---|
| 2010/0171087 A1 | 7/2010 | Kurotsuchi et al. |
| 2010/0182828 A1 | 7/2010 | Shima et al. |
| 2010/0219392 A1 | 9/2010 | Awaya et al. |
| 2010/0270593 A1 | 10/2010 | Lung et al. |
| 2011/0068316 A1 | 3/2011 | Takano et al. |
| 2011/0147691 A1 | 6/2011 | Yasutake |
| 2011/0235408 A1 | 9/2011 | Minemura et al. |
| 2011/0297912 A1 | 12/2011 | Samachisa et al. |
| 2012/0104351 A1* | 5/2012 | Wei et al. .......... 257/4 |
| 2012/0248399 A1* | 10/2012 | Sasago et al. ...... 257/4 |
| 2013/0010520 A1 | 1/2013 | Murooka |
| 2013/0094273 A1* | 4/2013 | Chien et al. ....... 365/63 |
| 2013/0153846 A1* | 6/2013 | Chien et al. ....... 257/2 |
| 2014/0027707 A1* | 1/2014 | Murooka ........... 257/5 |

FOREIGN PATENT DOCUMENTS

| | | |
|---|---|---|
| JP | 2011-66285 | 3/2011 |
| JP | 2011-129705 | 6/2011 |
| JP | 2011-199215 | 10/2011 |
| JP | 2012-15211 A | 1/2012 |
| JP | 2013-21297 A | 1/2013 |
| WO | WO 2008/142768 A1 | 11/2008 |

* cited by examiner

∘ : Oxygen Atom

FIG. 16

∘ : Oxygen Atom

SEMICONDUCTOR MEMORY DEVICE AND METHOD OF MANUFACTURING THE SAME

CROSS-REFERENCE TO RELATED APPLICATIONS

This application is based upon and claims the benefit of priority from the prior U.S. Patent Provisional Application No. 61/695,741, filed on Aug. 31, 2012, the entire contents of which are incorporated herein by reference.

BACKGROUND

1. Field

Present embodiments relate to a semiconductor memory device and a method of manufacturing the same.

2. Description of the Related Art

In recent years, along with increasingly high integration of semiconductor memory devices, LSI elements configuring these devices have been more and more miniaturized. This miniaturization of LSI elements requires not only simply that line width be narrowed, but also an improvement in dimensional accuracy, positional accuracy and so on of circuit patterns. An example of a technology that has been proposed for overcoming such problems is ReRAM (Resistive RAM) where a variable resistance element having a reversibly changeable resistance value is employed as a memory cell. Moreover, having this ReRAM adopt a VAL (Vertical Array Line) structure where the variable resistance element is provided between a side wall of a word line extending parallel to a substrate and a side wall of a bit line extending perpendicularly to the substrate enables even higher integration of a memory cell array to be achieved.

However, in the VAL structure, a variable resistance layer functioning as the ReRAM is provided not only on a side surface of the word line, but also on a side surface of an interlayer insulating layer between word lines. Therefore, a leak current occurs between word lines via the variable resistance layer. Moreover, this leak current causes malfunction of memory cells to occur and power consumption to increase.

DETAILED DESCRIPTION

A method of manufacturing a semiconductor memory device according to an embodiment described below relates to a semiconductor memory device comprising a memory cell array. The memory cell array includes a plurality of first lines, a plurality of second lines, and memory cells. The plurality of first lines and the plurality of second lines intersect each other. Each of the memory cell is disposed at each of intersections of the first lines and the second lines and each include a variable resistance element. In the method of manufacturing a semiconductor device, first, a plurality of first conductive layers functioning as the first lines and a plurality of interlayer insulating layers are stacked alternately on a substrate. Next, a trench penetrating the plurality of first conductive layers and the plurality of interlayer insulating layers is formed. Then, a side wall layer is formed on a side surface of the plurality of first conductive layers and a side surface of the plurality of interlayer insulating layers facing the trench. Next, a column-shaped conductive layer functioning as one of the second lines is formed to fill the trench via the side wall layer. Then, after formation of the side wall layer, by migration of oxygen atoms between the side wall layer and the first conductive layers or migration of oxygen atoms between the side wall layer and the interlayer insulating layers, a proportion of oxygen atoms in the side wall layer adjacent to the interlayer insulating layers is made larger than a proportion of oxygen atoms in the side wall layer adjacent to the first conductive layers, whereby the side wall layer adjacent to the first conductive layers is caused to function as the variable resistance element.

[Configuration]

Figure 1:
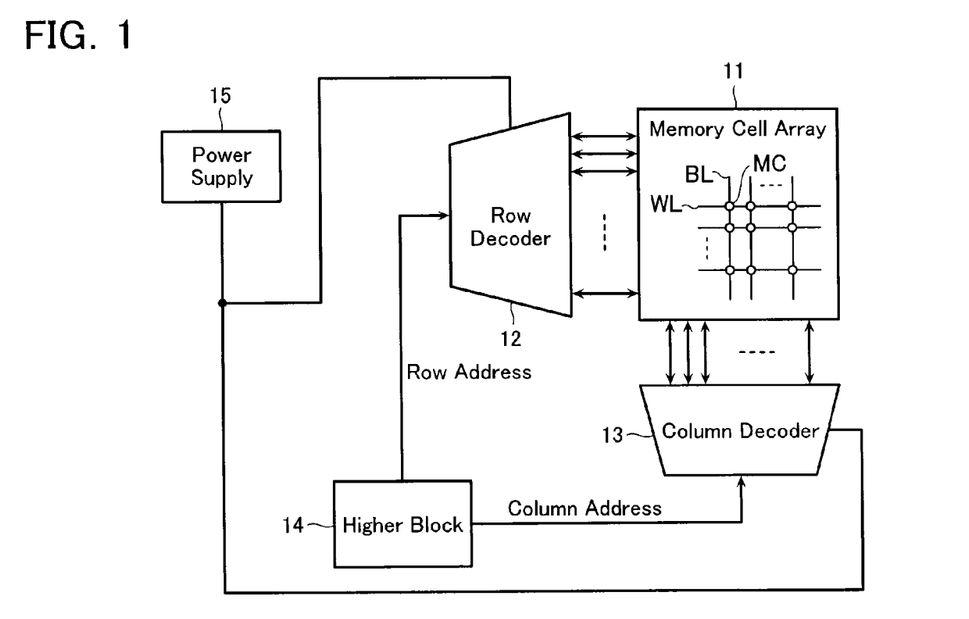
FIG. 1 is a block diagram of a semiconductor memory device according to an embodiment.

First, an overall configuration of a semiconductor memory device according to an embodiment is described. FIG. 1 is a block diagram of the semiconductor memory device according to the embodiment. As shown in FIG. 1, the semiconductor memory device includes a memory cell array 11, a row decoder 12, a column decoder 13, a higher block 14, and a power supply 15.

The memory cell array 11 includes a plurality of word lines WL and a plurality of bit lines BL that intersect each other, and memory cells MC each disposed at each of intersections of these word lines WL and bit lines BL. The row decoder 12 selects the word lines WL during access (data erase/write/read). The column decoder 13 selects the bit lines BL during access and includes a driver for controlling an access operation.

The higher block 14 selects the memory cell MC which is to be an access target in the memory cell array 11. The higher block 14 provides the row decoder 12 and the column decoder 13 with, respectively, a row address and a column address. The power supply 15 generates combinations of certain voltages corresponding to each of data erase/write/read operations, and supplies these combinations of voltages to the row decoder 12 and the column decoder 13.

Figure 2:
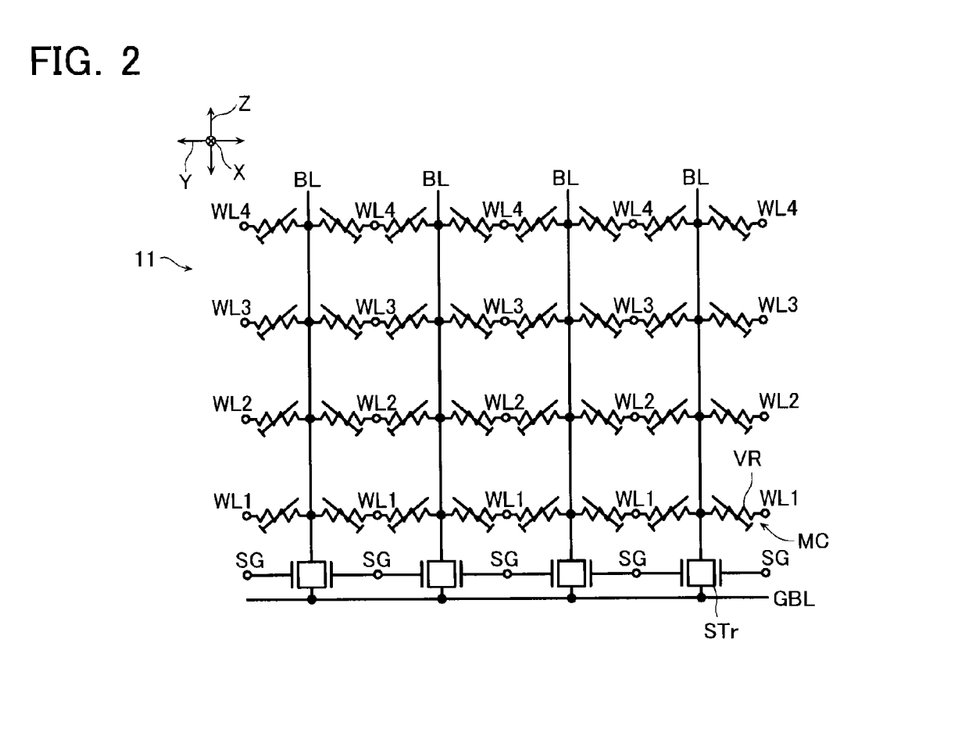
FIG. 2 is a circuit diagram of a memory cell array 11 according to the embodiment.

Next, the memory cell array 11 according to the embodiment is described in detail with reference to FIG. 2. FIG. 2 is a circuit diagram of the memory cell array 11. Note that in FIG. 2, an X direction, a Y direction, and a Z direction are orthogonal to each other, and the X direction is a direction perpendicular to the plane of paper. Moreover, structures shown in FIG. 2 are repeatedly provided in the X direction.

As shown in FIG. 2, the memory cell array 11 includes a select transistor STr, a global bit line GBL, and a select gate line SG, in addition to the above-mentioned word lines WL, bit lines BL, and memory cells MC.

As shown in FIG. 2, the word lines WL1~WL4 are arranged in the Z direction and extend in the X direction. The bit lines BL are arranged in a matrix in the X direction and the Y direction, and extend in the Z direction. The memory cells MC are disposed at places where these word lines WL and bit lines BL intersect. Therefore, the memory cells MC are arranged in a three-dimensional matrix in the X, Y, and Z directions.

As shown in FIG. 2, each of the memory cells MC includes a variable resistance element VR. The variable resistance element VR is electrically rewritable and stores data in a nonvolatile manner based on a resistance value of the variable resistance element VR. The variable resistance element VR attains a low-resistance state (set state) by a setting operation in which a voltage of a certain level or more is applied to both ends of the variable resistance element VR. The variable resistance element VR attains a high-resistance state (reset state) by a resetting operation in which a voltage of a certain level or more is applied to both ends of the variable resistance element VR. Moreover, immediately after manufacturing, the variable resistance element VR is in a high-resistance state where its resistance state is not easily changed. Accordingly, a forming operation where both ends of the variable resistance element VR are applied with a high voltage not less than that of the setting operation and resetting operation is executed. This forming operation results in an area where locally current flows easily in the variable resistance element VR (a filament path) being formed. Therefore the variable resistance element VR can easily have its resistance state changed, and attains a state of being operational as a storage element.

As shown in FIG. 2, the select transistor STr is provided between one end of the bit line BL and the global bit line GBL. The global bit lines GBL are aligned in the X direction and extend in the Y direction. One global bit line GBL is commonly connected to one ends of a plurality of select transistors STr arranged in a line in the Y direction. The select gate lines SG are aligned in the Y direction and extend in the X direction. One select gate line SG is commonly connected to gates of a plurality of select transistors STr arranged in a line in the X direction.

Figure 3:
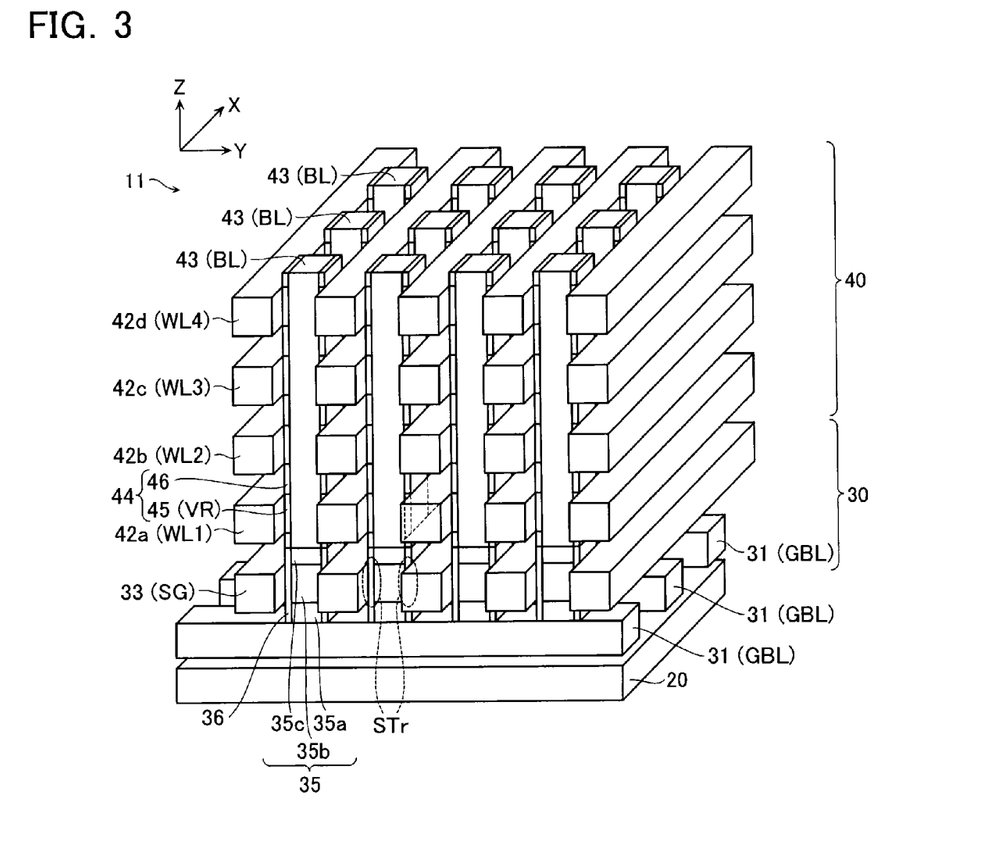
FIG. 3 is a perspective view showing a stacking structure of the memory cell array 11 according to the embodiment.
Figure 4:
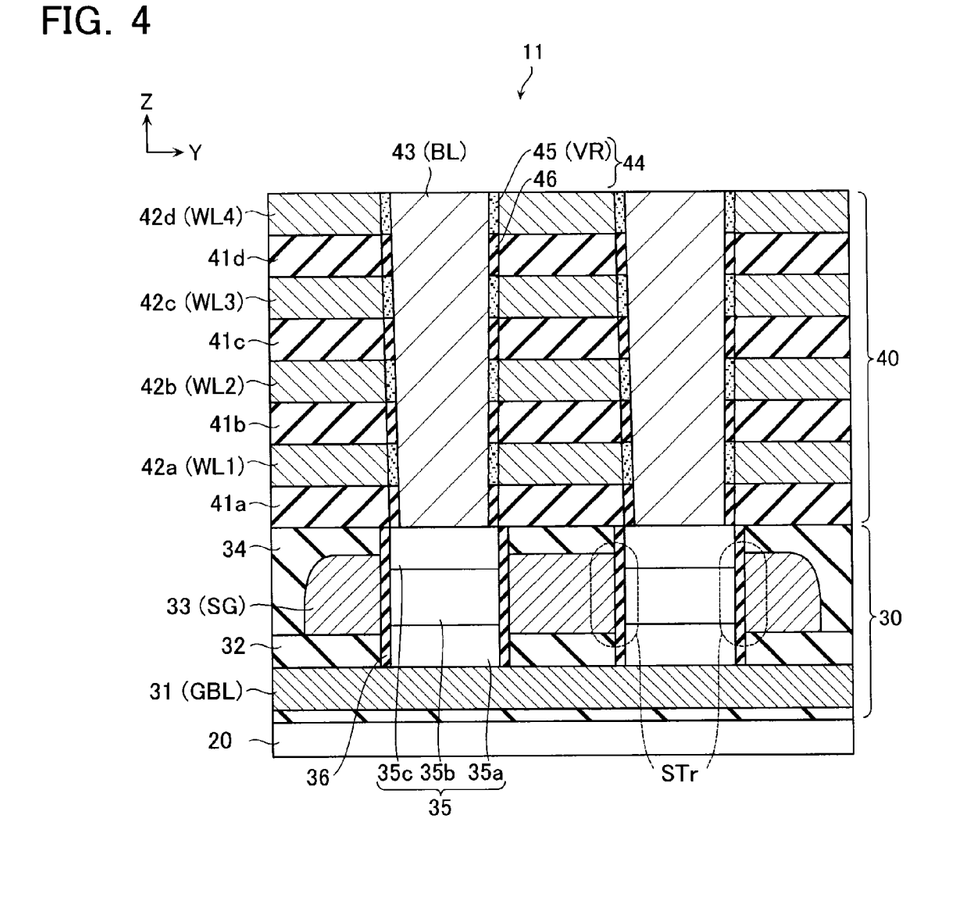
FIG. 4 is a cross-sectional view of FIG. 3.
Figure 5:
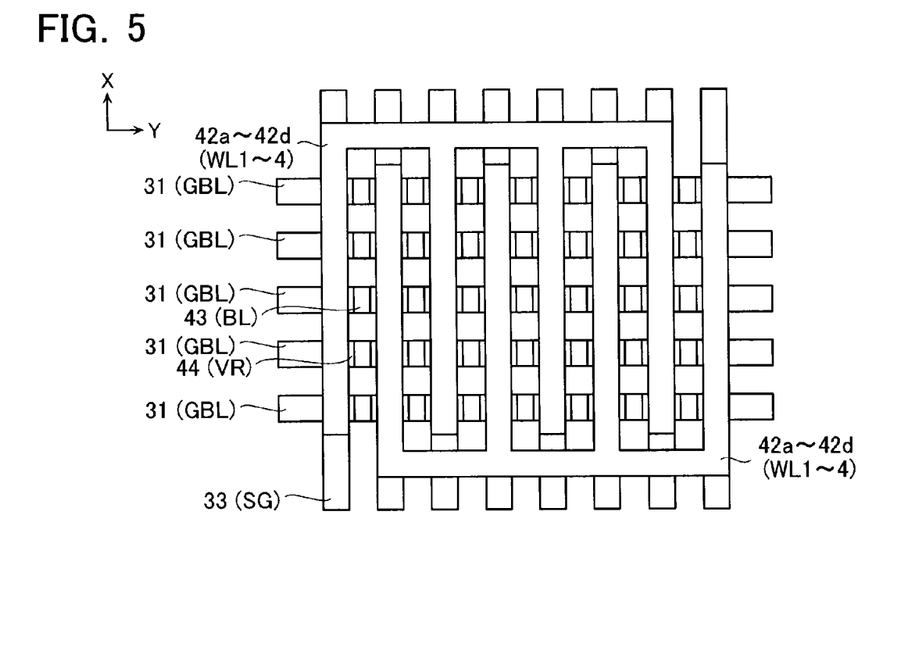
FIG. 5 is a top view of FIG. 3.

Next, a stacking structure of the memory cell array according to the embodiment is described with reference to FIGS. 3 to 5. FIG. 3 is a perspective view showing the stacking structure of the memory cell array 11. FIG. 4 is a cross-sectional view of FIG. 3, and FIG. 5 is a top view of FIG. 3. Note that in FIGS. 3 and 5, interlayer insulating layers are omitted.

As shown in FIGS. 3 and 4, the memory cell array 11 includes a select transistor layer 30 and a memory layer 40 that are stacked on a substrate 20. The select transistor layer 30 functions as the select transistor STr, and the memory layer 40 functions as the memory cell MC.

As shown in FIGS. 3 and 4, the select transistor layer 30 includes a conductive layer 31, an interlayer insulating layer 32, a conductive layer 33, and an interlayer insulating layer 34 that are stacked in the Z direction perpendicular to the substrate 20. The conductive layer 31 functions as the global bit line GBL, and the conductive layer 33 functions as the select gate line SG and a gate of the select transistor STr.

The conductive layers 31 are aligned with a certain pitch in the X direction and extend in the Y direction parallel to the substrate 20 (refer to FIG. 5). The interlayer insulating layer 32 covers an upper surface of the conductive layer 31. The conductive layers 33 are aligned with a certain pitch in the Y direction and extend in the X direction (refer to FIG. 5). The interlayer insulating layer 34 covers a side surface and an upper surface of the conductive layer 33. For example, the conductive layers 31 and 33 are configured by polysilicon. The interlayer insulating layers 32 and 34 are configured by silicon oxide ($SiO_2$).

In addition, as shown in FIGS. 3 and 4, the select transistor layer 30 includes a column-shaped semiconductor layer 35 and a gate insulating layer 36. The column-shaped semiconductor layer 35 functions as a body (channel) of the select transistor STr, and the gate insulating layer 36 functions as a gate insulating film of the select transistor STr.

The column-shaped semiconductor layers 35 are disposed in a matrix in the X and Y directions, and extend in the Z direction. Moreover, the column-shaped semiconductor layer 35 contacts an upper surface of the conductive layer 31, and contacts a side surface of an end in the Y direction of the conductive layer 33 via the gate insulating layer 36. Furthermore, the column-shaped semiconductor layer 35 includes an N+ type semiconductor layer 35$a$, a P+ type semiconductor layer 35$b$, and an N+ type semiconductor layer 35$c$ that are stacked.

As shown in FIGS. 3 and 4, the N+ type semiconductor layer 35$a$ contacts the interlayer insulating layer 32 at a side surface in the Y direction of the N+ type semiconductor layer 35$a$. The P+ type semiconductor layer 35$b$ contacts a side surface of the conductive layer 33 at a side surface in the Y direction of the P+ type semiconductor layer 35$b$. The N+ type semiconductor layer 35$c$ contacts the interlayer insulating layer 34 at a side surface in the Y direction of the N+ type semiconductor layer 35$c$. The N+ type semiconductor layers 35$a$ and 35$c$ are configured by polysilicon implanted with an N+ type impurity, and the P+ type semiconductor layer 35$b$ is configured by polysilicon implanted with a P+ type impurity. The gate insulating layer 36 is configured by for example silicon oxide ($SiO_2$).

As shown in FIGS. 3 and 4, the memory layer 40 includes interlayer insulating layers 41$a$~41$d$ and conductive layers 42a~42d that are stacked alternately in the Z direction. The conductive layers 42a~42d function as the word lines WL1~WL4.

As shown in FIG. 5, the conductive layers 42a~42d each include a pair of comb-tooth shapes opposing each other in the X direction. The interlayer insulating layers 41a~41d are configured by for example silicon oxide ($SiO_2$), and the conductive layers 42a~42d are configured by for example polysilicon.

Moreover, as shown in FIGS. 3 and 4, the memory layer 40 includes a column-shaped conductive layer 43 and a side wall layer 44. The column-shaped conductive layers 43 are disposed in a matrix in the X and Y directions, and each contacts an upper surface of the column-shaped conductive layer 35 and extends in a column shape in the Z direction. The column-shaped conductive layer 43 functions as the bit line BL.

The side wall layer 44 is provided on aside surface of an end in the Y direction of the column-shaped conductive layer 43. As shown in FIGS. 3 and 4, the side wall layer 44 includes a variable resistance layer 45 and an oxide layer 46. The variable resistance layer 45 functions as the variable resistance element VR. The oxide layer 46 has a lower conductivity than the variable resistance layer 45.

The variable resistance layer 45 is provided between the column-shaped conductive layer 43 and a side surface of an end in the Y direction of the conductive layers 42a~42d. The oxide layer 46 is provided between the column-shaped conductive layer 43 and aside surface of an end in the Y direction of the interlayer insulating layers 41a~41d.

The column-shaped conductive layer 43 is configured by for example polysilicon, and the side wall layer 44 (variable resistance layer 45 and oxide layer 46) is configured by for example a metal oxide. More specifically, the variable resistance layer 45 is configured by the likes of $HfO_x$, $Al_2O_x$, $TiO_x$, $NiO_x$, $WO_x$, and $Ta_2O_x$ that are in a more oxygen-deficient state than a stoichiometric state. The oxide layer 46 is configured by the likes of $HfO_2$, $Al_2O_3$, $TiO_2$, NiO, $WO_3$, and $Ta_2O_5$ that are in a stoichiometric state.

As is clear from the above, in the present embodiment, the variable resistance layer 45 (variable resistance element VR) is provided between a side surface of the conductive layers 42a~42d (word lines WL) extending in parallel to the substrate 20 and a side surface of the column-shaped conductive layer 43 (bit line BL) extending perpendicularly to the substrate 20. Accordingly, the present embodiment allows a high level of integration of the memory cell array 11 to be achieved. Furthermore, in the present embodiment, the oxide layer 46 having a lower conductivity than the variable resistance layer 45 is provided between a side surface of the interlayer insulating layers 41a~41d and a side surface of the column-shaped conductive layer 43. Accordingly, the present embodiment enables a leak current between the conductive layers 42a~42d (word lines WL1~WL4) to be suppressed by the oxide layer 46.

[First Method of Manufacturing]

Next, a first method of manufacturing a semiconductor memory device according to the embodiment is described with reference to FIGS. 6 to 15. FIGS. 6 to 14 are perspective views showing the first method of manufacturing the memory cell array 11, and FIG. 15 is an enlarged cross-sectional view showing the first method of manufacturing the memory cell array 11. Note that the method of manufacturing described below shows only a method of manufacturing the memory layer 40.

Figure 6:
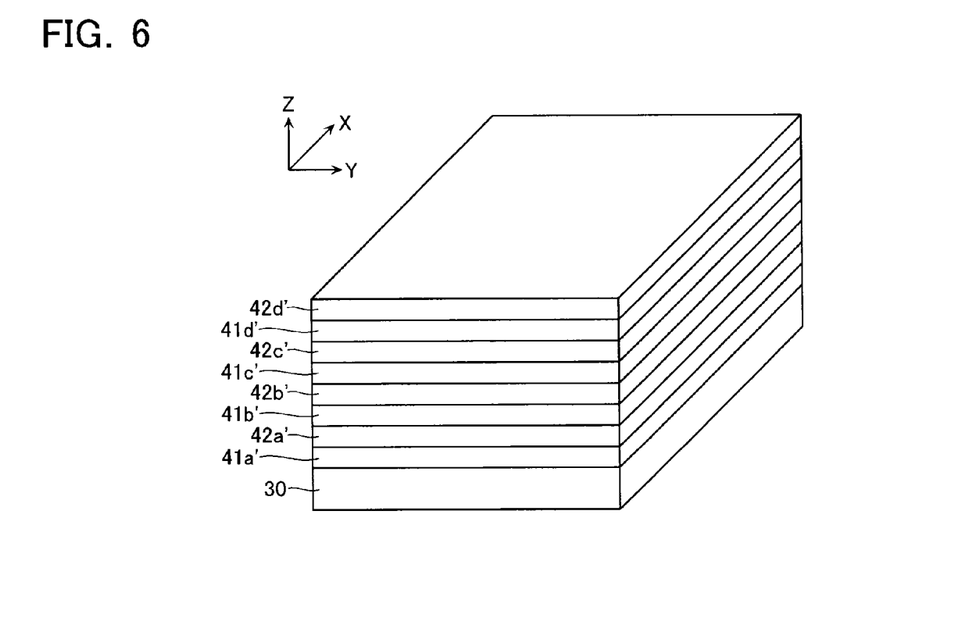
FIG. 6 is a perspective view showing a first method of manufacturing the memory cell array 11 according to the embodiment.

First, as shown in FIG. 6, silicon oxide ($SiO_2$) and polysilicon (Si) are stacked alternately on an upper surface of the select transistor layer 30 to form the interlayer insulating layers 41a'~41d' and the conductive layers 42a'~42d' extending in the X direction and the Y direction.

Figure 7:
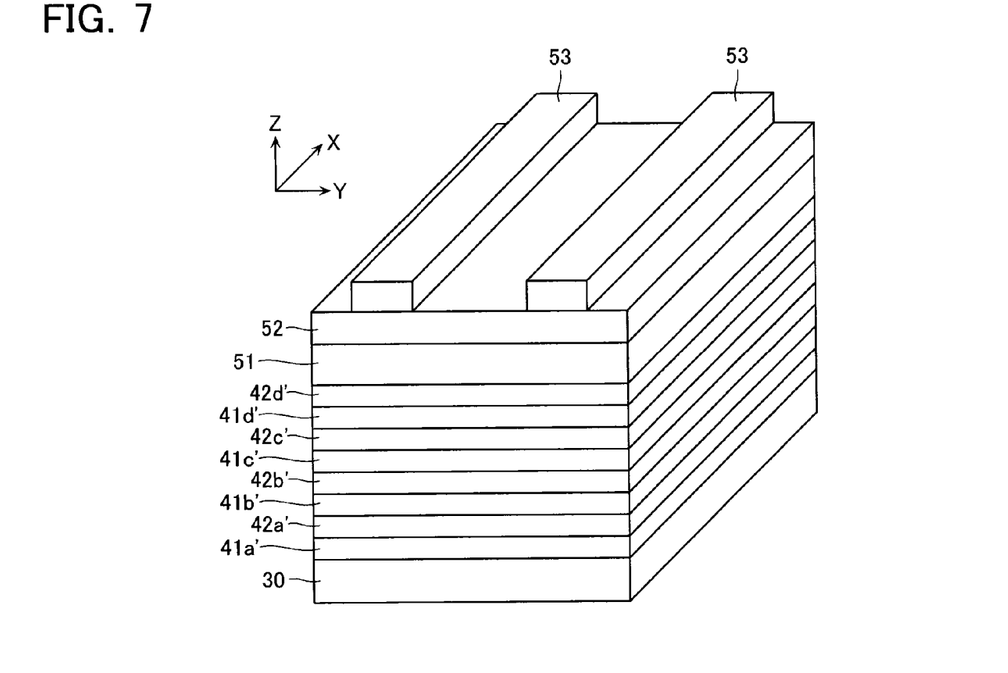
FIG. 7 is a perspective view showing the first method of manufacturing the memory cell array 11 according to the embodiment.

Next, as shown in FIG. 7, insulating layers 51 and 52 are stacked on the conductive layer 42d'. Then, an etching mask 53 is stacked on an upper surface of the insulating layer 52. The etching masks 53 are formed using a photo etching process and reactive ion etching to be aligned with a certain pitch in the Y direction and extend in the X direction.

Figure 8:
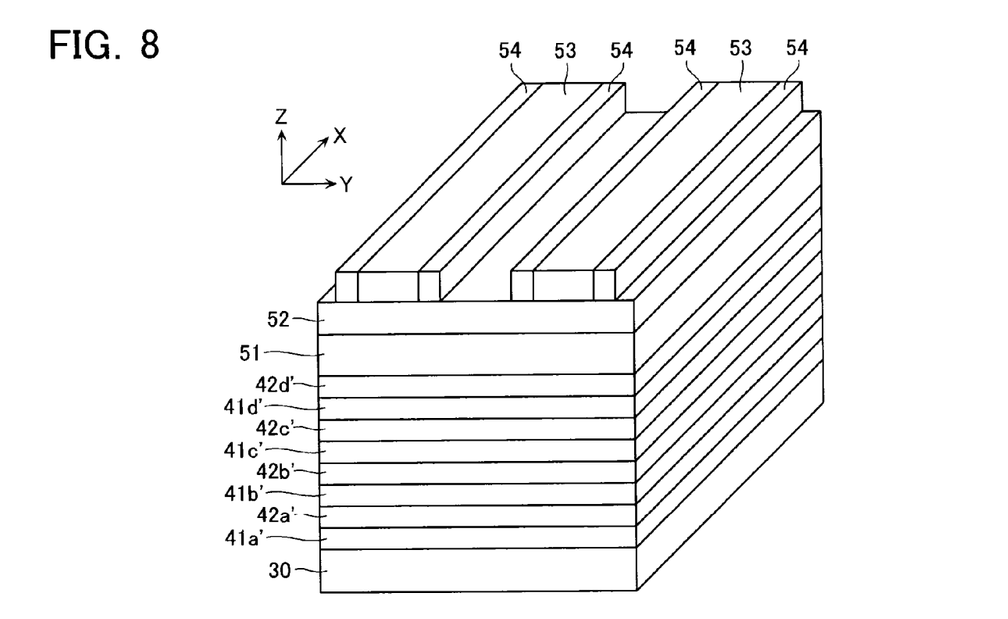
FIG. 8 is a perspective view showing the first method of manufacturing the memory cell array 11 according to the embodiment.

Then, as shown in FIG. 8, a mask material is deposited on the insulating layer 52 and the etching mask 53, and then etching back is performed. This etching back results in a side wall mask 54 being formed on a side surface of an end in the Y direction of the etching mask 53.

Figure 9:
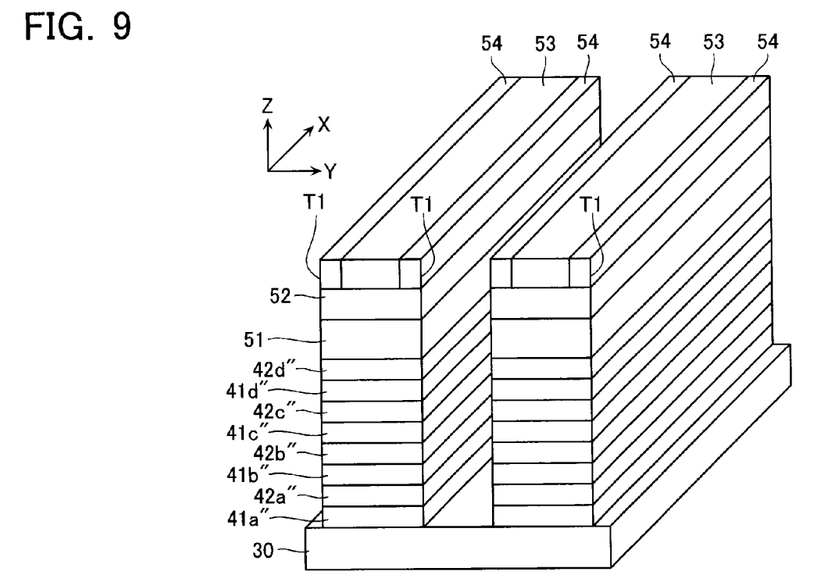
FIG. 9 is a perspective view showing the first method of manufacturing the memory cell array 11 according to the embodiment.

Then, as shown in FIG. 9, etching of the interlayer insulating layers 41a'~41d' and the conductive layers 42a'~42d' is performed using the etching mask 53 and the side wall mask 54 as masks, thereby forming a trench T1. This trench T1 reaches to an upper surface of the select transistor layer 30, whereby the upper surface of the select transistor layer 30 is exposed. The trench T1 causes the interlayer insulating layers 41a'~41d' and the conductive layers 42a'~42d' to become interlayer insulating layers 41a"~41d" and conductive layers 42a"~42d" processed into a shape aligned with a certain pitch in the Y direction and extending in the X direction.

Figure 10:
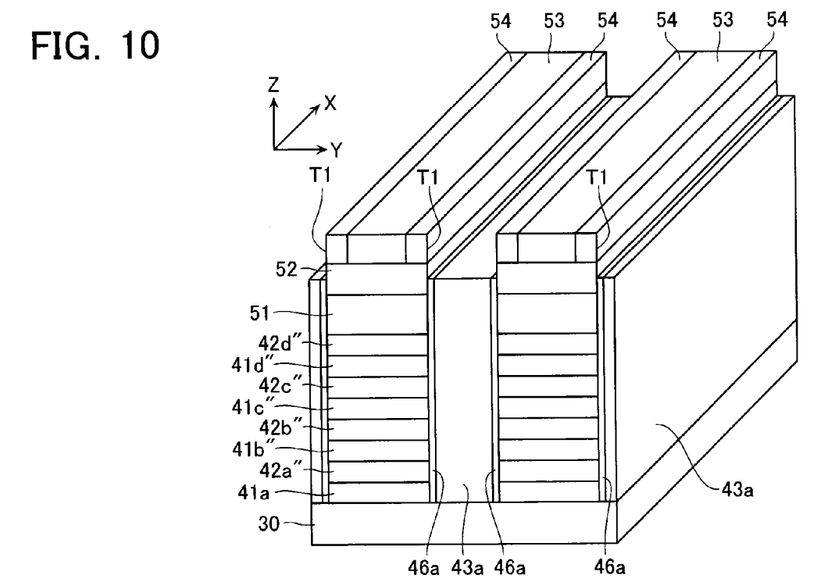
FIG. 10 is a perspective view showing the first method of manufacturing the memory cell array 11 according to the embodiment.

Then, as shown in FIG. 10, an oxide layer 46a (side wall layer) is formed on a side surface of the interlayer insulating layers 41a"~41d" and the conductive layers 42a"~42d" facing the trench T1. The oxide layer 46a is formed by a film-formation method of good isotropy (for example, atomic layer deposition (ALD)). Note that the oxide layer 46a is configured by the likes of $HfO_2$, $Al_2O_3$, $TiO_2$, NiO, $WO_3$, and $Ta_2O_5$ that are in a stoichiometric state. Then, polysilicon (Si) is deposited to fill the trench T1, thereby forming a conductive layer 43a.

Figure 11:
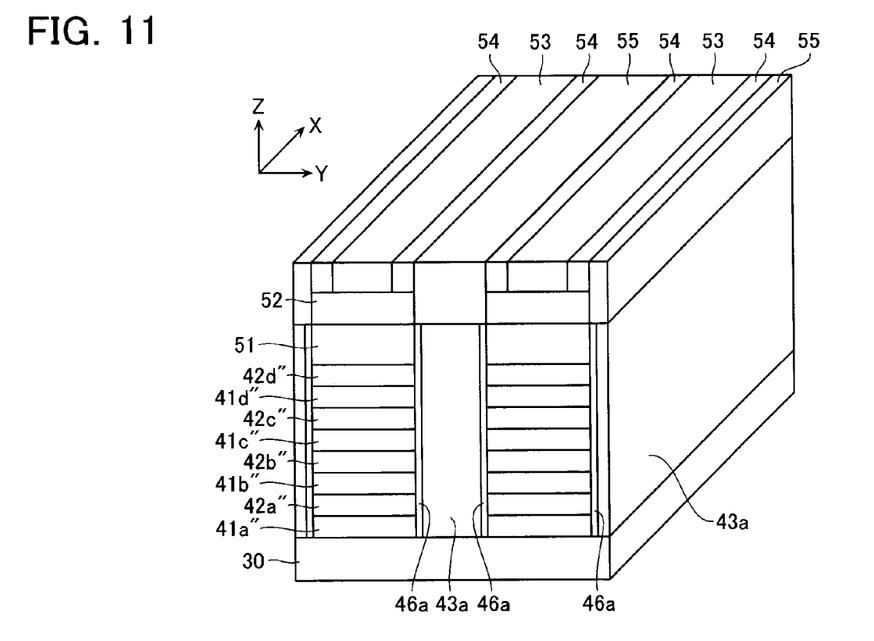
FIG. 11 is a perspective view showing the first method of manufacturing the memory cell array 11 according to the embodiment.

Then, as shown in FIG. 11, an etching mask 55 to be employed in a later etching process is deposited on the oxide layer 46a and the conductive layer 43a. Then, the etching masks 55 and 53, and the side wall mask 54 are planarized by CMP (Chemical Mechanical Polishing).

Figure 12:
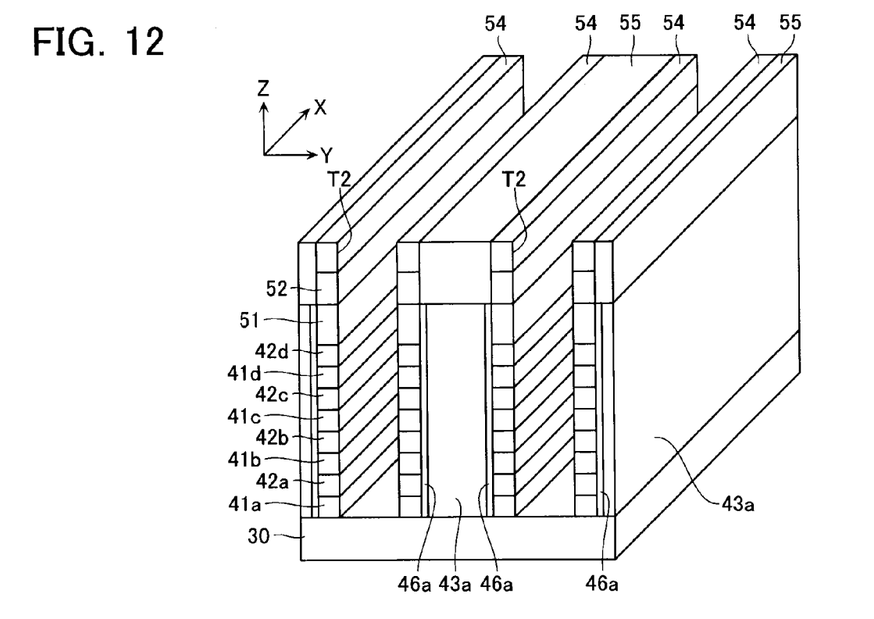
FIG. 12 is a perspective view showing the first method of manufacturing the memory cell array 11 according to the embodiment.

Next, as shown in FIG. 12, the etching mask 53 only is removed. Then, etching of the interlayer insulating layers 41a"~41d" and the conductive layers 42a"~42d" is performed using the etching mask 55 and the side wall mask 54 as masks, thereby forming a trench T2. This trench T2 reaches to an upper surface of the select transistor layer 30. The trench T2 causes the interlayer insulating layers 41a"~41d" and the conductive layers 42a"~42d" to become the interlayer insulating layers 41a~41d and the conductive layers 42a~42d having a shape further divided in the Y direction.

Figure 13:
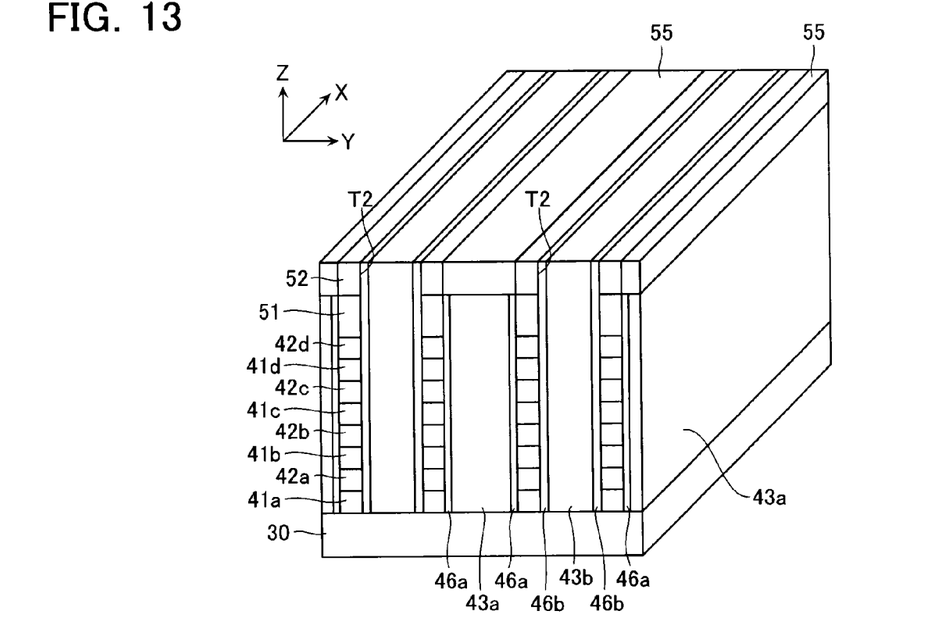
FIG. 13 is a perspective view showing the first method of manufacturing the memory cell array 11 according to the embodiment.

Then, as shown in FIG. 13, an oxide layer 46b (side wall layer) is formed on a side surface of the interlayer insulating layers 41a~41d and the conductive layers 42a~42d facing the trench T2. Then, polysilicon (Si) is deposited to fill the trench T2, thereby forming a conductive layer 43b. Then, CMP is used to planarize the conductive layer 43b and remove the side wall mask 54.

Figure 14:
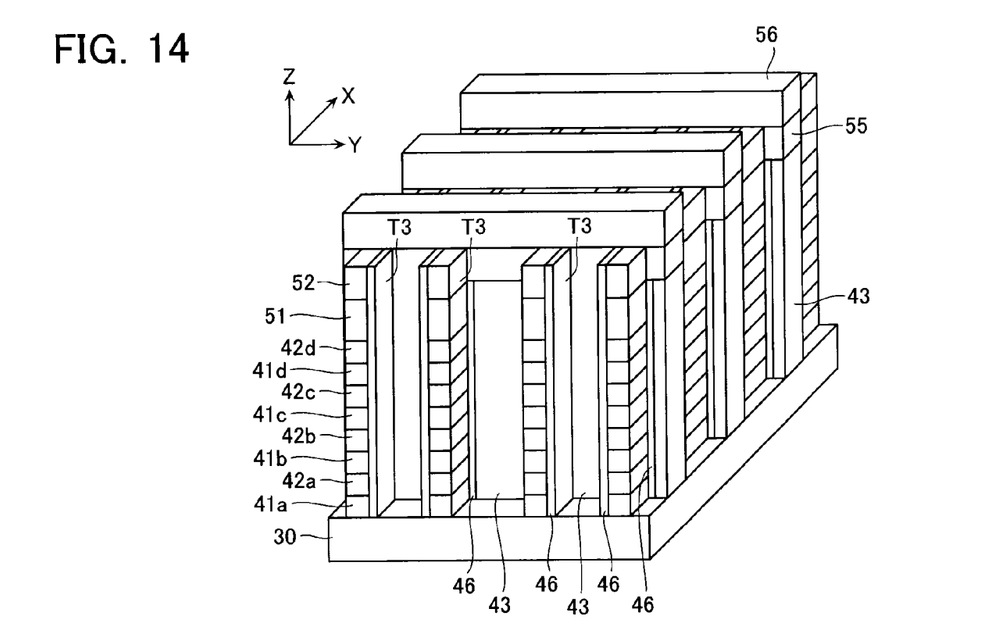
FIG. 14 is a perspective view showing the first method of manufacturing the memory cell array 11 according to the embodiment.
Figure 15:
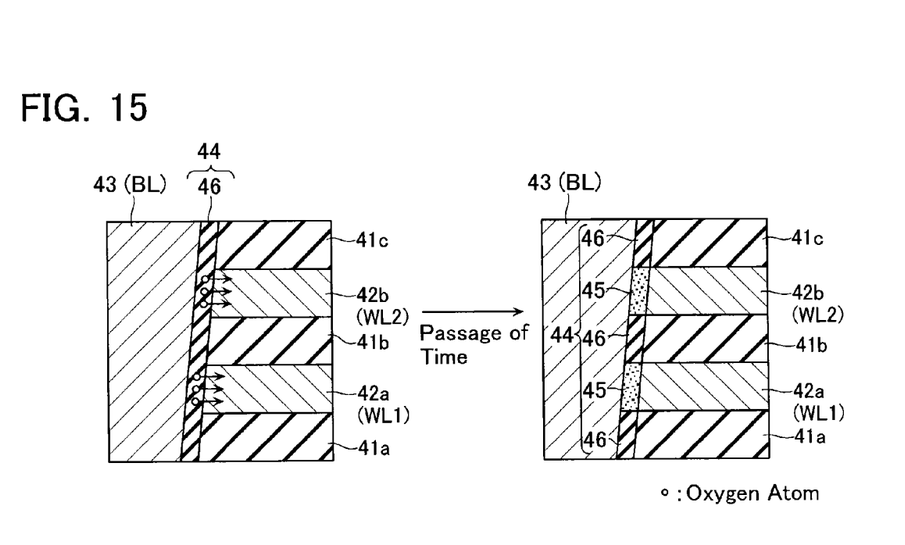
FIG. 15 is an enlarged cross-sectional view showing the first method of manufacturing the memory cell array 11 according to the embodiment.

Next, as shown in FIG. 14, an etching mask 56 is further formed on the etching mask 55. The etching mask 56 is formed to be aligned with a certain pitch in the X direction and extend in the Y direction. Then, etching of the conductive layers 43a and 43b and the oxide layers 46a and 46b is performed using this etching mask 56 and the insulating layer 52 as masks, thereby forming a trench T3. This trench T3 causes the conductive layers 43a and 43b to become the column-shaped conductive layer 43 having a column shape extending in the Z direction, and causes the oxide layers 46a and 46b to become the oxide layer 46 having a shape divided with a certain pitch in the X direction.

And so, the above-described processes result in the oxide layer 46 (side wall layer 44) being formed between the column-shaped conductive layer 43 and the interlayer insulating layers 41a~41d and conductive layers 42a~42d. Moreover, the oxide layer 46 is configured by the likes of $HfO_2$, $Al_2O_3$, $TiO_2$, NiO, $WO_3$, and $Ta_2O_5$ that are in a stoichiometric state. Therefore, as shown in FIG. 15, oxygen atoms in the oxide layer 46 gradually diffuse into the conductive layers 42a~42d. Thus, a proportion of oxygen atoms in the oxide layer 46 adjacent to the conductive layers 42a~42d becomes smaller than a proportion of oxygen atoms in the oxide layer 46 adjacent to the interlayer insulating layers 41a~41d. Accordingly, the oxide layer 46 adjacent to the conductive layers 42a~42d, after a certain time has passed from its formation, becomes the variable resistance layer 45. Note that the variable resistance layer 45 is configured by the likes of $HfO_x$, $Al_2O_x$, $TiO_x$, $NiO_x$, $WO_x$, and $Ta_2O_x$ that are in a more oxygen-deficient state than a stoichiometric state.

[Second Method of Manufacturing]

Figure 16:
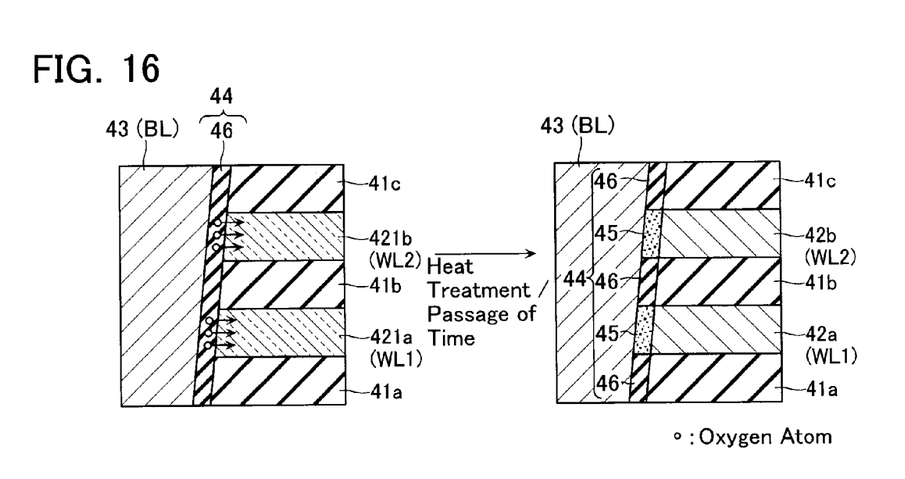
FIG. 16 is an enlarged cross-sectional view showing a second method of manufacturing the memory cell array 11 according to the embodiment.

Next, a second method of manufacturing a semiconductor memory device according to the embodiment is described with reference to FIG. 16. In the above-described first method of manufacturing, in the process shown in FIG. 6, the conductive layers 42a'~42d' are deposited in a state of polysilicon. In contrast, as shown in FIG. 16, in the second method of manufacturing, conductive layers 421a~421d configured by amorphous silicon are deposited in place of the conductive layers 42a'~42d'. In this respect, the second method of manufacturing differs from the first method of manufacturing. In other respects, similar processes to those in FIGS. 7 to 14 of the first method of manufacturing are executed also in the second method of manufacturing.

In addition, as shown in FIG. 16, heat treatment is executed. This results in part of the oxide layer 46 becoming the variable resistance layer 45 for similar reasons to those in the first method of manufacturing. The heat treatment results also in the conductive layers 421a~421d (amorphous silicon) being crystallized to become the conductive layers 42a~42d configured by polysilicon. Now, diffusion of oxygen atoms from the oxide layer 46 into the conductive layers 421a~421d (amorphous silicon) in the second method of manufacturing occurs more easily than diffusion of oxygen atoms from the oxide layer 46 into the conductive layers 42a~42d (polysilicon) in the first method of manufacturing. Therefore, the second method of manufacturing enables the variable resistance layer 45 to be formed more reliably than does the first method of manufacturing.

[Third Method of Manufacturing]

Figure 17:
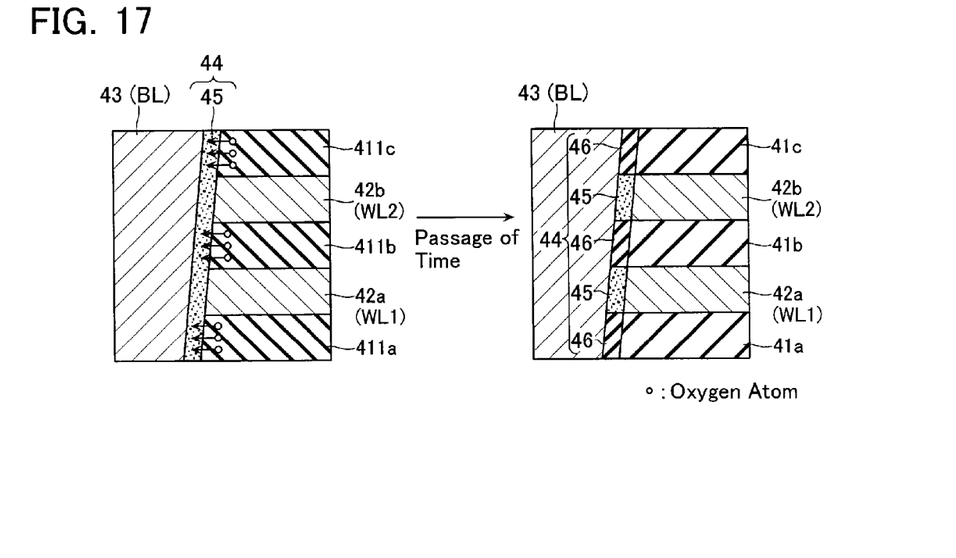
FIG. 17 is an enlarged cross-sectional view showing a third method of manufacturing the memory cell array 11 according to the embodiment.

Next, a third method of manufacturing a semiconductor memory device according to the embodiment is described with reference to FIG. 17. In the above-described first method of manufacturing, the process shown in FIG. 10 is undergone, whereby the oxide layer 46 (side wall layer 44) is formed on a side surface of the conductive layers 42a"~42d". In contrast, as shown in FIG. 17, in the third method of manufacturing, the variable resistance layer 45 (side wall layer 44) is formed on a side surface of the conductive layers 42a"~42d". Moreover, as shown in FIG. 17, in the third method of manufacturing, interlayer insulating layers 411a~411d having silicon oxide configured in a state where more oxygen atoms are included than a stoichiometric state are deposited in place of the interlayer insulating layers 41a'~41d'. In these respects, the third method of manufacturing differs from the first method of manufacturing.

The interlayer insulating layers (silicon oxide) 411a~411d are formed using for example chemical vapor deposition (CVD). Now, when forming silicon oxide in a stoichiometric state, flow rates of a reactive gas that becomes a silicon component (for example, $SiH_4$, and so on) and a reactive gas that becomes an oxygen component (for example, $N_2O$ or $O_2$, and so on) are controlled such that a composition ratio Si:O of silicon oxide is precisely 1:2. In contrast, in the present method of manufacturing, a supplied amount of the reactive gas that becomes the oxygen component is made slightly larger than in the case of forming silicon oxide in a stoichiometric state.

As shown in FIG. 17, when the variable resistance layer 45 and the interlayer insulating layers 411a~411d are formed as in the above-described third method of manufacturing, oxygen atoms in the interlayer insulating layers 411a~411d gradually diffuse into the variable resistance layer 45. Therefore, a proportion of oxygen atoms in the variable resistance layer 45 adjacent to the interlayer insulating layers 41a~41d becomes larger than a proportion of oxygen atoms in the variable resistance layer 45 adjacent to the conductive layers 42a~42d. Accordingly, the variable resistance layer 45 adjacent to the interlayer insulating layers 41a~41d, after a certain time has passed from its formation, becomes the oxide layer 46. Moreover, a proportion of oxygen atoms in the interlayer insulating layers 411a~411d lowers, whereby the interlayer insulating layers 411a~411d, after a certain time has passed from their formation, become the interlayer insulating layers 41a~41d in a stoichiometric state.

[Fourth Method of Manufacturing]

Figure 18:
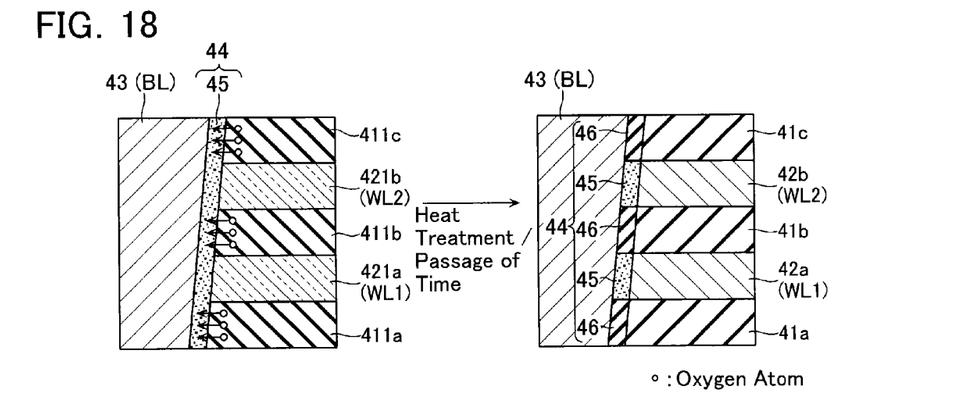
FIG. 18 is an enlarged cross-sectional view showing a fourth method of manufacturing the memory cell array 11 according to the embodiment.

Next, a fourth method of manufacturing a semiconductor memory device according to the embodiment is described with reference to FIG. 18. In the above-described third method of manufacturing, the conductive layers 42a'~42d' are deposited in a state of polysilicon. In contrast, as shown in FIG. 18, in the fourth method of manufacturing, conductive layers 421a~421d configured by amorphous silicon are deposited in place of the conductive layers 42a'~42d'. In this respect, the fourth method of manufacturing differs from the third method of manufacturing.

In addition, as shown in FIG. 18, heat treatment is executed. This results in part of the variable resistance layer 45 becoming the oxide layer 46 for similar reasons to those in the third method of manufacturing. The heat treatment results also in the conductive layers 421a~421d (amorphous silicon) being crystallized to become the conductive layers 42a~42d configured by polysilicon. Now, diffusion of oxygen atoms from the variable resistance layer 45 into the conductive layers 421a~421d (amorphous silicon) in the fourth method of manufacturing occurs more easily than diffusion of oxygen atoms from the variable resistance layer 45 into the conductive layers 42a~42d (polysilicon) in the third method of manufacturing. Therefore, the fourth method of manufacturing enables changing of the variable resistance layer 45 adjacent to the conductive layers 42a~42d into the oxide layer 46 to be suppressed more than does the third method of manufacturing.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 19:
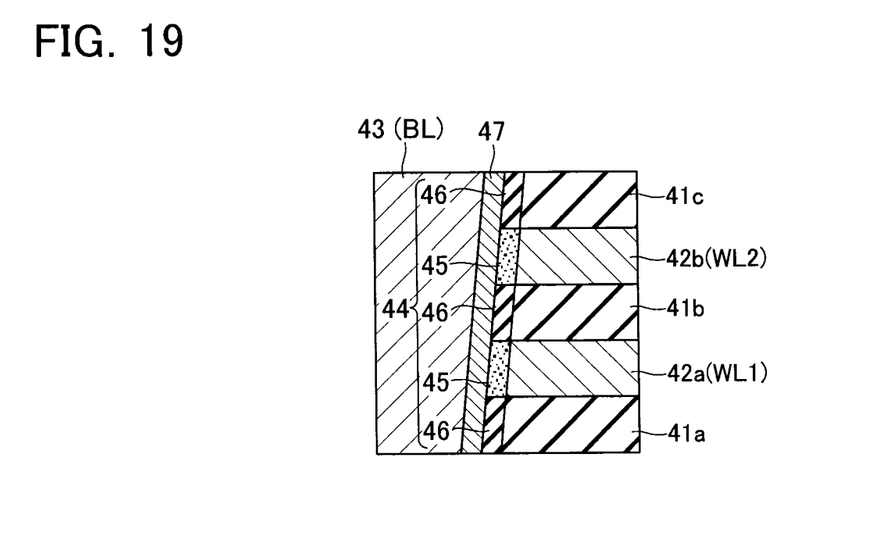
FIG. 19 is an enlarged cross-sectional view showing a stacking structure of a memory cell array 11 according to another embodiment.
Figure 20:
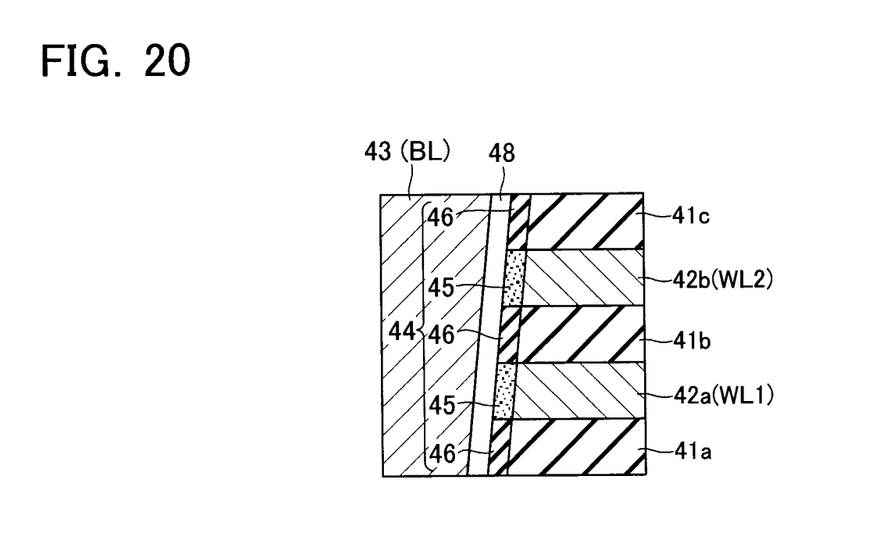
FIG. 20 is an enlarged cross-sectional view showing a stacking structure of a memory cell array 11 according to another embodiment.

For example, as shown in FIG. 19, a barrier metal layer 47 configured by titanium nitride (TiN) may be provided between a side surface of the side wall layer 44 (variable resistance layer 45 and oxide layer 46) and the column-shaped conductive layer 43 (BL). Moreover, as shown in FIG. 20, an n type or p type polycrystalline silicon layer (Si) 48 for promoting resistance change of the variable resistance layer 45 may be provided between the side surface of the side wall layer 44 (variable resistance layer 45 and oxide layer 46) and the column-shaped conductive layer 43 (BL).

In addition, the conductive layers 33 and 42a~42d may be configured by titanium nitride (TiN) or tungsten (W).

What is claimed is:

1. A method of manufacturing a semiconductor memory device, the semiconductor memory device comprising a memory cell array comprising: a plurality of first lines and a plurality of second lines intersecting each other; and a plurality of memory cells each disposed at each of intersections of the plurality of first lines and the plurality of second lines and each including a variable resistance element, the method comprising:
   stacking a plurality of first conductive layers and a plurality of interlayer insulating layers alternately on a substrate, the first conductive layers functioning as the first lines;
   forming a trench that penetrates the plurality of first conductive layers and the plurality of interlayer insulating layers;
   forming a side wall layer on a side surface of the plurality of first conductive layers facing the trench and on a side surface of the plurality of interlayer insulating layers facing the trench;
   forming a column-shaped conductive layer to fill the trench via the side wall layer, the column-shaped conductive layer functioning as one of the second lines; and
   after formation of the side wall layer, by migration of oxygen atoms between the side wall layer and the first conductive layers or migration of oxygen atoms between the side wall layer and the interlayer insulating layers, making a proportion of oxygen atoms in the side wall layer adjacent to the interlayer insulating layers larger than a proportion of oxygen atoms in the side wall layer adjacent to the first conductive layers, thereby causing the side wall layer adjacent to the first conductive layers to function as the variable resistance element.

2. The method of manufacturing a semiconductor memory device according to claim 1, wherein
   the first conductive layers are formed by amorphous silicon, and
   after formation of the side wall layer, heat treatment is executed to crystallize the amorphous silicon in the first conductive layers into polysilicon.

3. The method of manufacturing a semiconductor memory device according to claim 1, wherein the side wall layer is formed using ALD.

4. The method of manufacturing a semiconductor memory device according to claim 1, wherein the interlayer insulating layers are formed using CVD.

5. The method of manufacturing a semiconductor memory device according to claim 1, wherein the side wall layer is configured by an oxide of any of Hf, Al, Ti, Ni, W, and Ta.

6. The method of manufacturing a semiconductor memory device according to claim 1, wherein the migration of oxygen atoms occurs after a certain time elapsed after the formation of the side wall layer.

7. The method of manufacturing a semiconductor memory device according to claim 1, wherein
   the side wall layer is formed by a metal oxide in a stoichiometric state, and
   after formation of the side wall layer, oxygen atoms in the side wall layer adjacent to the first conductive layers are caused to migrate to the first conductive layers.

8. The method of manufacturing a semiconductor memory device according to claim 7, wherein
   the first conductive layers are formed by amorphous silicon, and
   after formation of the side wall layer, heat treatment is executed to crystallize the amorphous silicon in the first conductive layers into polysilicon.

9. The method of manufacturing a semiconductor memory device according to claim 1, wherein
   the side wall layer is formed by a metal oxide in a more oxygen-depleted state than a stoichiometric state, and
   after formation of the side wall layer, oxygen atoms in the interlayer insulating layers are caused to migrate to the side wall layer adjacent to the interlayer insulating layers.

10. The method of manufacturing a semiconductor memory device according to claim 9, wherein the interlayer insulating layers are formed by an oxide in a more oxygen-rich state than a stoichiometric state.

11. The method of manufacturing a semiconductor memory device according to claim 9, wherein
    the first conductive layers are formed by amorphous silicon, and
    after formation of the side wall layer, heat treatment is executed to crystallize the amorphous silicon in the first conductive layers into polysilicon.

12. A semiconductor memory device, comprising a memory cell array including a plurality of first lines and a plurality of second lines intersecting each other, and a plurality of memory cells each disposed at each of intersections of the plurality of first lines and the plurality of second lines and each including a variable resistance element,
    the memory cell array comprising:
    a plurality of first conductive layers aligned with a certain pitch in a perpendicular direction to a substrate and functioning as the first lines;
    an interlayer insulating layer provided between the first conductive layers;
    a variable resistance layer provided on a side surface of the first conductive layers and functioning as the variable resistance element;
    an oxide layer provided on a side surface of the interlayer insulating layer and having a lower conductivity than the variable resistance layer; and
    a column-shaped conductive layer provided on a side surface of the first conductive layers via the variable resistance layer and provided on a side surface of the interlayer insulating layer via the oxide layer, the column-shaped conductive layer extending in the perpendicular direction and functioning as one of the second lines, wherein
    the oxide layer is configured by a metal oxide in a stoichiometric state, and
    the variable resistance layer is configured by a metal oxide in a more oxygen-depleted state than a stoichiometric state.

13. The semiconductor memory device according to claim 12, further comprising a barrier metal layer provided between a side surface of the variable resistance layer and the column-shaped conductive layer, and between a side surface of the oxide layer and the column-shaped conductive layer,
    wherein the barrier metal layer is configured by titanium nitride (TiN).

14. The semiconductor memory device according to claim 12, further comprising: an N type or P type polycrystalline silicon layer provided between a side surface of the variable resistance layer and the column-shaped conductive layer, and between a side surface of the oxide layer and the column-shaped conductive layer.

15. The semiconductor memory device according to claim 12, further comprising:
    a select transistor having one end connected to one end of the second lines;
    a select gate line connected to a gate of the select transistor; and
    a third line connected to the other end of the select transistor.

16. The semiconductor memory device according to claim 15, wherein the memory cell array further comprises:
    a second conductive layer extending in a parallel direction to the substrate and functioning as the third line;
    a column-shaped semiconductor layer in contact with an upper surface of the second conductive layer and a lower surface of the column-shaped conductive layer, the column-shaped semiconductor layer extending in the perpendicular direction to the substrate and functioning as a body of the select transistor;
    a gate insulating layer provided on a side surface of the column-shaped semiconductor layer; and
    a third conductive layer provided on a side surface of the column-shaped semiconductor layer via the gate insulating layer, the third conductive layer extending in the parallel direction to the substrate and functioning as the gate of the select transistor and the select gate line.

17. The semiconductor memory device according to claim 16, wherein the column-shaped semiconductor layer comprises:
    a first column-shaped semiconductor layer including an impurity of a first conductivity type;
    a second column-shaped semiconductor layer in contact with an upper surface of the first column-shaped semiconductor layer and including an impurity of a second conductivity type; and
    a third column-shaped semiconductor layer in contact with an upper surface of the second column-shaped semiconductor layer and including an impurity of the first conductivity type.

18. The semiconductor memory device according to claim 12, wherein the first conductive layer is configured by polysilicon.

19. The semiconductor memory device according to claim 12, wherein the first conductive layer is configured by a metal.

20. The semiconductor memory device according to claim 12, wherein the interlayer insulating layer is configured by silicon oxide.

* * * * *